(12) United States Patent  
Gray

(10) Patent No.: US 6,476,602 B1  
(45) Date of Patent: Nov. 5, 2002

(54) TEMPERATURE COMPENSATED HALL SENSOR FOR TESTING MAGNETIC RECORDING HEADS

(75) Inventor: David M. Gray, Bloomington, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 51 days.

(21) Appl. No.: 09/677,638

(22) Filed: Oct. 3, 2000

Related U.S. Application Data

(60) Provisional application No. 60/182,826, filed on Feb. 16, 2000.

(51) Int. Cl.[7] .......................... G01K 33/07; H01L 43/06
(52) U.S. Cl. ................... 324/210; 324/225; 324/251; 327/511
(58) Field of Search ................. 324/210, 211, 324/212, 225, 252; 338/324; 327/510, 511, 513

(56) References Cited

U.S. PATENT DOCUMENTS

| | | | |
|---|---|---|---|
| 4,646,014 A | 2/1987 | Eulenberg | 324/251 |
| 4,833,406 A | 5/1989 | Foster | 324/225 |
| 4,857,842 A | 8/1989 | Sturman et al. | 324/225 |
| 5,260,614 A | 11/1993 | Theus et al. | 307/491 |
| 5,818,225 A | * 10/1998 | Miekley et al. | 324/251 |

* cited by examiner

Primary Examiner—Walter E. Snow  
(74) Attorney, Agent, or Firm—Westman, Champlin & Kelly

(57) ABSTRACT

A head testing apparatus is provided for testing a magnetic data recording head. The apparatus includes a test volume adapted to receive the magnetic data recording head and a magnetic field source positioned to generate a magnetic field within the test volume. A Hall sensor is positioned relative to the test volume and has bias current input terminals, voltage output terminals, an operating temperature and an impedance between the bias current input terminals, which varies with the operating temperature. A bias current source is electrically coupled to the bias current input terminals and is adapted to provide a bias current, which is modulated based on the impedance of the Hall sensor.

11 Claims, 4 Drawing Sheets

TEMPERATURE COMPENSATED HALL SENSOR FOR TESTING MAGNETIC RECORDING HEADS

CROSS-REFERENCE TO RELATED APPLICATION

This application claims priority from U.S. Provisional Application No. 60/182,826, filed Feb. 16, 2000, and entitled "HIGH PERFORMANCE TRANSFER CURVE TESTER AND TEMPERATURE COMPENSATED HALL SENSOR."

FIELD OF THE INVENTION

The present invention relates to magnetic field sensors and, more particularly, to a temperature compensated Hall sensor for testing magnetic recording heads for data storage systems.

BACKGROUND OF THE INVENTION

Many data storage systems use magnetic recording heads for writing information to and reading information from a magnetic medium. For example, disc drives of the "Winchester" type have one or more rigid discs, which are coated with a magnetizable medium for storing digital information in a plurality of circular, concentric data tracks. The discs are mounted on a spindle motor, which causes the discs to spin and the surfaces of the discs to pass under respective head suspension assemblies. Head suspension assemblies carry transducers which write information to and read information from the disc surface. An actuator mechanism moves the head suspension assemblies from track-to-track across the surfaces of the discs under control of electronic circuitry. "Floppy-type" disc drives use flexible discs, which also have circular, concentric data tracks. For a tape drive, the information is stored along linear tracks on the tape surface.

In these applications, several different types of transducers have been used that rely on magnetic properties for writing to and/or reading from the magnetic medium. For an inductive-type transducer, the direction of current through the transducer is controlled during a write operation to encode magnetic flux reversals on the surface of the medium within the selected data track. When retrieving data from the medium, the inductive transducer is positioned over the data track to sense the flux reversals stored in the data track and generate a read signal based on those flux reversals. In a magnetoresistive type of transducing head, the flux reversals cause a change in the resistance of the head, which is sensed by a detector circuit. Typically, a reference current is passed through the magneto-resistive head and the change in resistance is sensed by measuring changes in the voltage across the head. Other types of detecting circuits can also be used.

In order to understand the basic physics of a magnetic transducing head during development and manufacturing, it is common to test the response of the head to an applied magnetic field. For example, one series of tests is known as "Transfer Curve Testing". To generate a transfer curve for a particular transducing head, the head is placed in a magnetic field (steady state or time varying) and the output signal from the transducing head is measured. The transfer curve is simply a plot of the output signal versus the applied magnetic field, where the field is varied from some negative value to some positive value, which is usually the same magnitude as the negative value. For a magneto-resistive type of head, the output signal consists of a steady state voltage, which is a function of the bias current applied to the head, the bulk resistance of the head and the applied magnetic field.

Typical characteristics that can be measured from the transfer curve data include read signal amplitude at maximum field, noise with zero field, noise with applied field, linearity over some range of field, and symmetry. Symmetry is a comparison of the read signal amplitude with a maximum positive field and the read signal amplitude with a maximum negative field.

In order to interpret the transfer curve data accurately, it is important that the strength of the magnetic field that is applied to the transducing head be known. Hall sensors are traditionally used to measure the magnetic field in transfer curve testers. The magnetic field is typically created by passing a current through a set of coils positioned relative to the transducing head. The current passing through the coils generates heat, which increases the temperature of the Hall sensor. Since Hall sensors have a large temperature coefficient, the increase in temperature affects the output of the Hall sensor. Therefore, it is important to implement some sort of temperature compensation in a magnetic head testing devices.

Traditional methods of temperature compensation have been found to add noise to the Hall sensor output, increase the size of the Hall sensor and compromise band width. For example, in one method of temperature compensation, a temperature sensor is placed immediately adjacent to the Hall sensor to generate a temperature measurement that can be used for compensating the output of the Hall sensor. In this method, the temperature sensor should be placed as close as possible to the Hall sensor so that the temperature measurement is accurate. However, when testing a miniature transducing head, the increased size of the Hall sensor caused by the addition of the temperature sensor can prohibit the Hall sensor from being mounted directly in the area of interest adjacent to head. This can cause additional errors to be introduced if the sensed magnetic field is not identical to the field being applied to the head.

Thus, a head testing apparatus and Hall sensor having improved temperature compensation are desired.

SUMMARY OF THE INVENTION

One aspect of the present invention is directed to a head testing apparatus for testing a magnetic data recording head. The apparatus includes a test volume adapted to receive the magnetic data recording head and a magnetic field source positioned to generate a magnetic field within the test volume. A Hall sensor is positioned relative to the test volume and has bias current input terminals, voltage output terminals, an operating temperature and an impedance between the bias current input terminals, which varies with the operating temperature. A first bias current source is electrically coupled to the bias current input terminals and is adapted to provide a first bias current, which is modulated based on the impedance of the Hall sensor.

Another aspect of the present invention is directed to a method of compensating a voltage output of a Hall sensor for changes in the temperature of the Hall sensor. The method includes: applying a first bias current to bias current inputs of the Hall sensor, measuring a representation of an impedance of the Hall sensor, wherein the impedance of the Hall sensor varies with the temperature of the Hall sensor, and modulating the first bias current as a function of the measured representation of the impedance of the Hall sensor.

Yet another aspect of the present invention relates to a temperature compensated Hall sensor circuit, which includes a Hall sensor and a bias current source. The Hall sensor has bias current input terminals, voltage output terminals, an operating temperature and an impedance between the bias current input terminals, which varies with the operating temperature. The bias current source applies a bias current to the bias current inputs of the Hall sensor and modulates the bias current as a function of the impedance of the Hall sensor to reduce effects of the operating temperature of the Hall sensor at the voltage output terminals of the Hall sensor.

DETAILED DESCRIPTION OF ILLUSTRATIVE EMBODIMENTS

Figure 1:
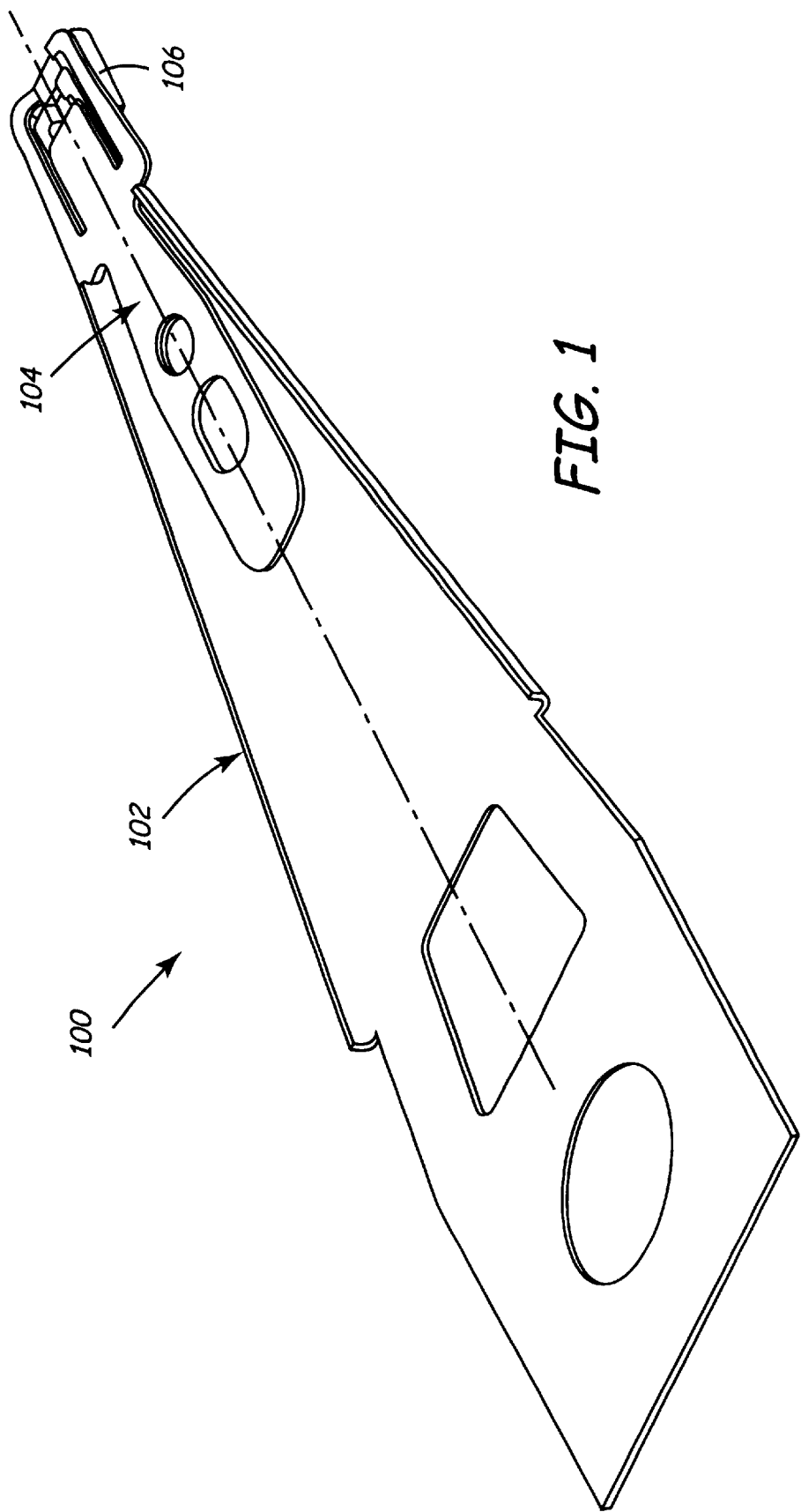
FIG. 1 is a perspective view a typical head suspension assembly for a rigid disc drive.

FIG. 1 is a perspective view of a typical head suspension assembly for a rigid disc drive. Head suspension assembly 100 includes suspension 102, flexure 104 and slider 106. Slider 106 carriers a transducer for writing to and/or reading. from a disc surface in a disc drive. Slider 106 can carry a variety of different types of transducers in alternative embodiments, such as an inductive-type transducer, a magneto-resistive type transducer, a giant magneto-resistive transducer, a spin tunnel junction transducer or a magneto-optical transducer. During operation, suspension 100 is attached to an actuator mechanism (not shown), which moves suspension 100 and the transducer carried by slider 106 from track-to-track across the surface of the disc under control of electronic circuitry.

Figure 2:
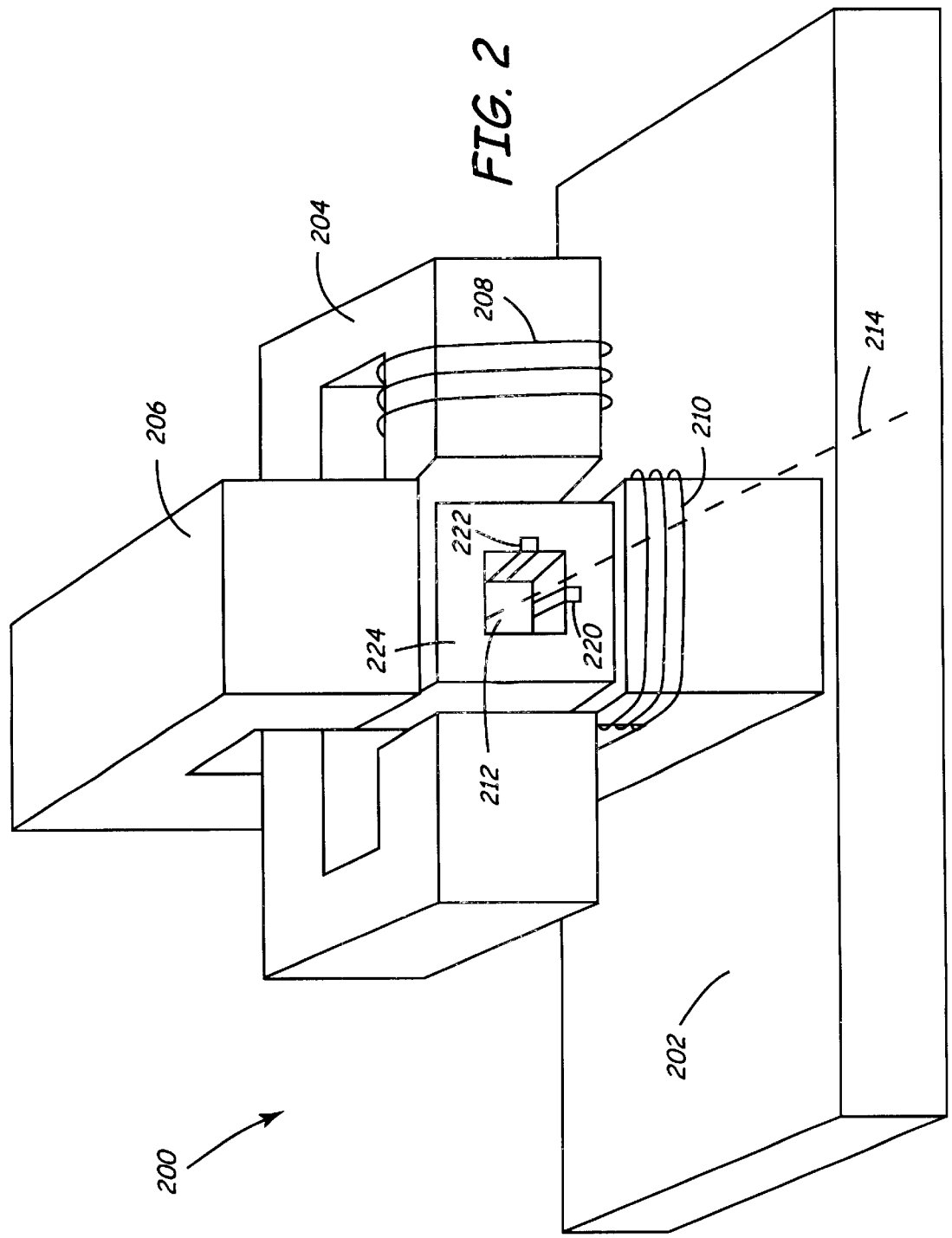
FIG. 2 is a simplified diagram of a head testing apparatus according to one embodiment of the present invention.

FIG. 2 is a simplified diagram of an apparatus for testing the response of a transducer, such as the transducer carried by slider 106 in FIG. 1, to an applied magnetic field, according to one embodiment of the present invention. The particular testing apparatus shown in FIG. 2 is provided as an example only. It should be understood that any suitable apparatus can be used to generate a magnetic field for testing a magnetic head or other magnetically responsive device in accordance with alternative embodiments of the present invention. Head testing apparatus 200 includes base 202, magnetic cores 204 and 206, windings 208 and 210 and air gap 212. Cores 204 and 206 are arranged to generate a magnetic field (simple or complex) across air gap 212 in orthogonal directions when excited by windings 208 and 210. Air gap 212 forms a test volume for receiving a magnetic transducer under test. The magnetic transducer is inserted into air gap 212 along axis 214 by a suitable positioning device. In one embodiment, air gap 212 is sized to receive the distal end of a head suspension assembly, such as that shown in FIG. 1, so as to position slider 106 and is attached transducer between opposing faces of cores 204 and 206. However, air gap 212 can be sized to receive a plurality of head suspension assemblies, such as those carried by an E-block actuator assembly in alternative embodiments.

When the transducer being tested is positioned within air gap 212, windings 208 and 210 are excited to generate a selected magnetic field in air gap 212 according to a predetermined test pattern. The response of the transducer being tested is then measured and analyzed. In order to interpret the transducer's response accurately, it is important that the strength of the magnetic field that is applied to the transducer within air gap 212 be known.

Hall sensors 220 and 222 are positioned relative to air gap 212 to measure the strength of the magnetic field that is applied across the air gap. In one embodiment, Hall sensors 220 and 222 are supported by a magnetically permeable material 224, which is positioned about air gap 212 between cores 204 and 206. Hall sensor 220 measures the magnetic field generated between the opposing faces of core 204, and Hall sensor 222 measures the magnetic field generated between the opposing faces of core 206.

During operation, the current being passed through coils 208 and 210 generates heat that can affect the measurement outputs of Hall sensors 220 and 222. For example, excitation of coils 208 and 210 can raise the ambient temperature in and around air gap 212 from 20° C. to 60–80° C. or more. Since Hall sensors have a large temperature coefficient, this temperature change can have a large effect on the measurement output of each Hall sensor. As described in more detail below, head testing apparatus 200 compensates for these temperature effects by using the Hall sensor itself as a temperature sensor. Since no additional temperature sensors are needed, the Hall sensors 220 and 222 can be easily mounted directly in the area of interest adjacent to the transducing head under test within air gap 212.

Figure 3:
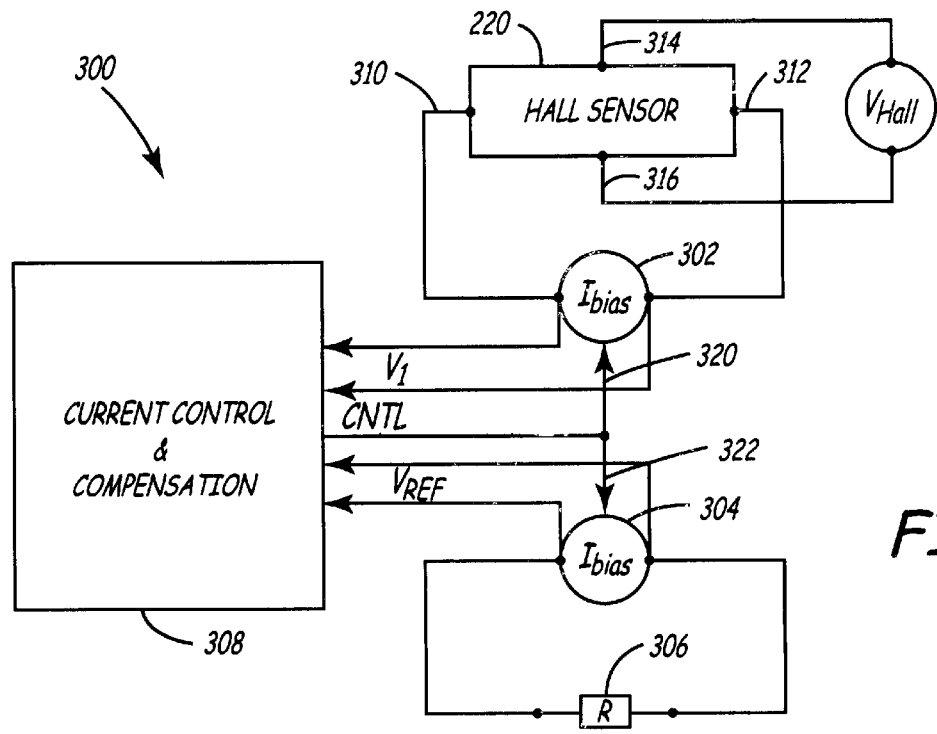
FIG. 3 is a block diagram of a Hall sensor bias circuit having a reference load, which is used with the head testing apparatus shown in FIG. 2 according to one embodiment of the present invention.

FIG. 3 is a block diagram of a circuit for biasing Hall sensor 220 according to one embodiment of the present invention. A similar circuit can be used for biasing Hall sensor 222. Bias circuit 300 includes current sources 302 and 304, reference load 306 and current control and temperature compensation circuit 308. Current source 302 is electrically coupled in series with the bias current input terminals 310 and 312 of Hall sensor 220, while current source 304 is electrically coupled in series with reference load 306. Current sources 302 and 304 have current control terminals 320 and 322, respectively, which are coupled to control output CNTL of current control and temperature compensation circuit 308. Circuit 308 controls the level of the bias current $I_{BIAS}$ provided by current sources 302 and 304 by controlling the value of CNTL. The control output CNTL can include an analog level such as a voltage or current for controlling bias current sources 302 and 304. In one embodiment, current sources 302 and 304 are adjustable, constant current sources.

The bias current $I_{BIAS}$ provided by current source 302 excites Hall sensor 220, which responsively generates an output voltage $V_{HALL}$. The voltage output, $V_{HALL}$ is proportional to the bias current $I_{BIAS}$ applied to the Hall sensor, the temperature $T_{HALL}$ of the Hall sensor and the applied magnetic field $H_{APPLIED}$. The impedance $Z_{HALL}$ of the Hall sensor between bias current inputs 310 and 312 is also proportional to the temperature $T_{HALL}$. By modulating the bias current $I_{BIAS}$ with the impedance $Z_{HALL}$, the temperature effects on voltage output $V_{HALL}$ can be reduced or removed. The voltage $V_{HALL}$ can then be used for accurately interpreting the output of the transducing head under test.

In the embodiment shown in FIG. 3, the impedance $Z_{HALL}$ is measured by monitoring the voltage $V_1$ across current source 302, which is essentially the voltage across bias current inputs 310 and 312 of Hall sensor 220. This voltage $V_1$ is fed back to current control and compensation circuit 300. Current source 304 is used to measure the impedance $Z_{REF}$ of reference load 306. Reference load 306 is positioned relative to Hall sensor 220 such that the operating temperature of reference load 306 is substantially independent of the operating temperature of Hall sensor 220. This provides a reference impedance with which to compare the impedance of Hall sensor 220. Current source 304 provides a bias current $I_{BIAS}$ to reference load 306 as a function of the control output CNTL applied to current control input 322. In one embodiment, the bias current supplied by current source 304 is substantially the same as the bias current supplied by current source 302. However, these two bias currents can differ from one another by a know factor in alternative embodiments. The voltage $V_{REF}$ across bias current source 304 is also fed back to control and compensation circuit 308. Current control and compensation circuit 308 measures the difference between $Z_{HALL}$ (as represented by $V_1$) and $Z_{REF}$ (as represented by $V_{REF}$) and modulates $I_{BIAS}$ through control output CNTL as a function of the difference to remove or reduce the dependence of $V_{HALL}$ on the temperature $T_{HALL}$ of Hall sensor 220.

Current control and compensation circuit 308 can be implemented in a variety of different circuit configurations. For example, circuit 308 can include a discrete analog control circuit, a discrete digital control circuit or state machine, or a programmed computer such as microcontroller, for example.

Figure 4:
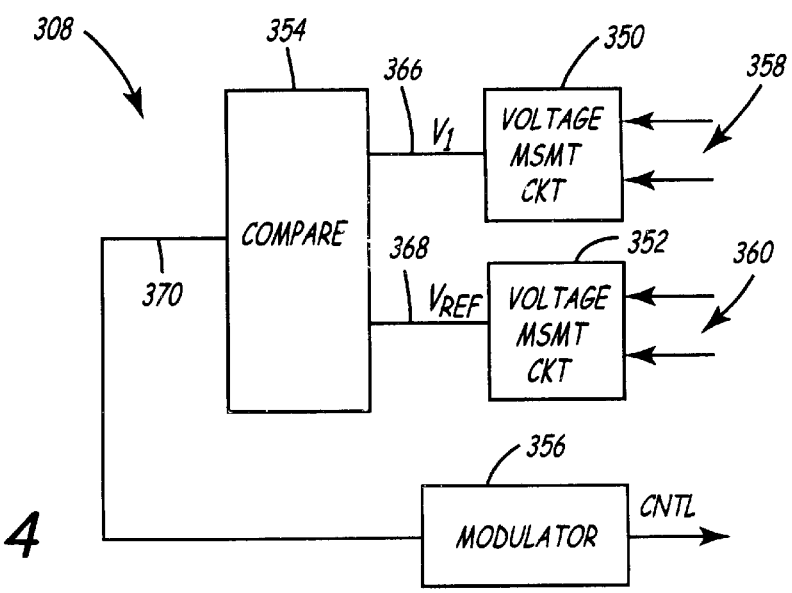
FIG. 4 is a block diagram of a current control and temperature compensation circuit used within the bias circuit shown in FIG. 3, according to one embodiment of the present invention.

FIG. 4 is a block diagram of current control and compensation circuit 308, which is implemented as a discrete analog control circuit, according to one embodiment of the present invention. Circuit 308 includes voltage measurement circuits 350 and 352, comparator 354 and modulator 356. The outputs of current source 302 (shown in FIG. 3) are provided to the inputs 358 of voltage measurement circuit 350, which measures the magnitude of voltage $V_1$. The outputs of current source 304 (shown in FIG. 3) are provided to the inputs 360 of voltage measurement circuit 352, which measures the magnitude of voltage $V_{REF}$. The measured voltages $V_1$ and $V_{REF}$ at outputs 362 and 364 of circuits 350 and 352 are applied to inputs 366 and 368, respectively of comparator 354. Comparator 354 generates an output 370 which is representative of the difference between $V_1$ and $V_{REF}$. As mentioned above, this difference is proportional to the difference between $Z_{HALL}$ and $Z_{REF}$. The output 370 of comparator 354 forms a modulation control value that is applied to the input of modulator 356. Modulator 356 modulates control output CNTL as a function of the difference between $Z_{HALL}$ and $Z_{REF}$ as reflected by the modulation control value on comparator output 358. Control output CNTL is then used to modulate the bias currents $I_{BIAS}$ supplied by current sources 302 and 304.

Figure 5:
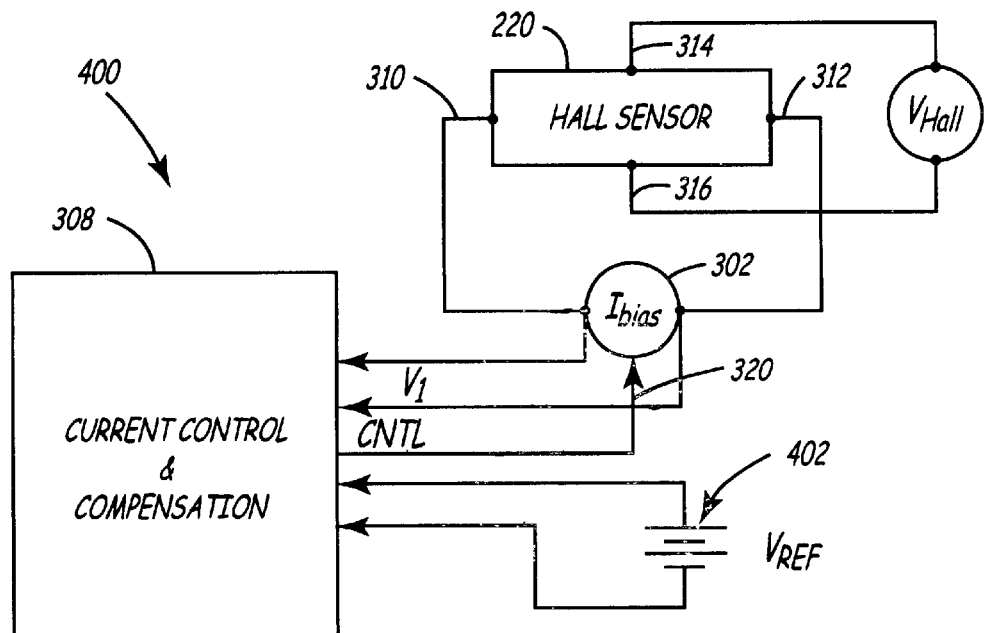
FIG. 5 is a block diagram of a Hall sensor bias circuit having a reference voltage, according to an alternative embodiment of the present invention.

FIG. 5 is a block diagram of a Hall sensor bias circuit 400 according to an alternative embodiment of the present invention. The same reference numerals are used in FIG. 5 as were used in FIG. 3 for the same or similar elements. In FIG. 5, a reference voltage source 402 is used to generate the reference voltage $V_{REF}$, which is representative of a nominal reference impedance for Hall sensor 220. Current control and compensation circuit 308 compares the value of $V_1$ with the value of $V_{REF}$ in a similar manner as discussed above with reference to FIG. 3. Any other method or apparatus for generating a value representative of a reference impedance, voltage, current or temperature can also be used in alternative embodiments of the present invention.

Figure 6:
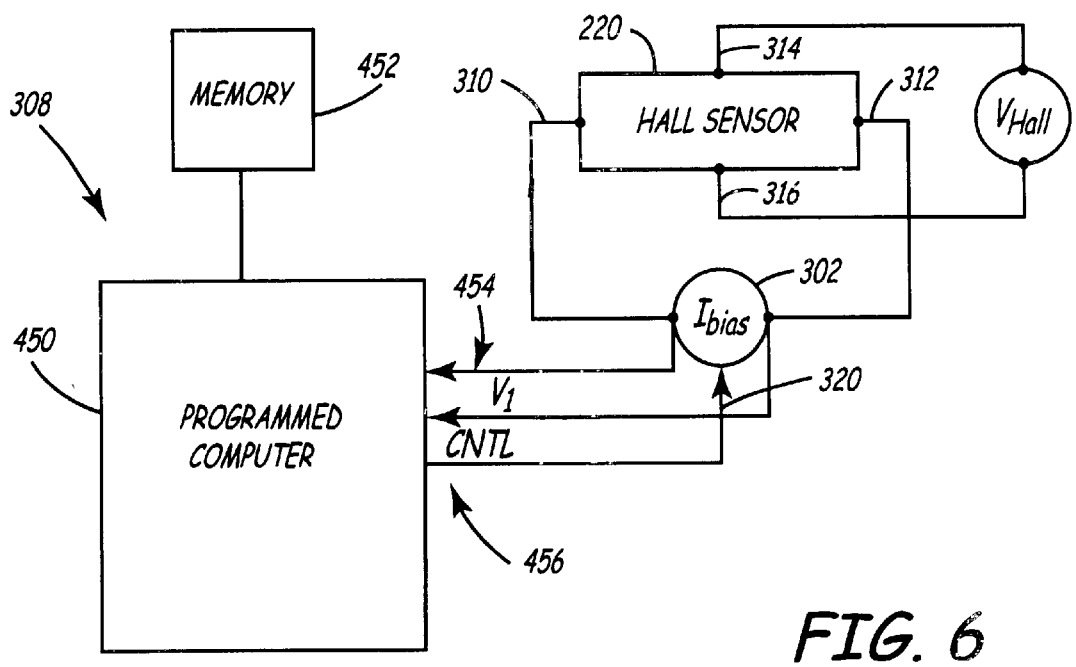
FIG. 6 is a block diagram of a Hall sensor bias circuit, which performs temperature compensation through a programmed computer, according to another alternative embodiment of the present invention.

FIG. 6 is a block diagram of a Hall sensor bias circuit 500 according to another alternative embodiment of the present invention. In this embodiment, current control and compensation circuit 308 includes a programmed computer 450 and a computer readable memory 452. Computer 450 executes a temperature compensation software program based on instructions stored in memory 452. The voltage $V_1$ is digitized in a known manner and applied to input 454 of computer 450. Computer 450 sets CNTL to a nominal value, measures the voltage $V_1$ and then calculates the impedance $Z_{HALL}$ based on the measured voltage $V_1$ and a nominal current level $I_{BIAS,NOM}$, which is stored in memory 452. The value of $I_{BIAS,NOM}$ represents the setting of the bias current supplied by current source 302 when CNTL is at the nominal value. The calculated impedance $Z_{HALL}$ is then compared with a nominal impedance value $Z_{REF}$ stored in memory 452 to produce a modulation control value which is used to modulate the control output CNTL and thus $I_{BIAS}$. The nominal impedance value $Z_{REF}$ reflects the impedance of Hall sensor 220 at a nominal temperature, such as room temperature.

In each of the above embodiments, the Hall sensor itself is used as a temperature sensor, which eliminates the need for a separate temperature sensing device. This maintains the small size of the Hall sensor, which allows the sensor to be positioned within the small test volume used to test miniature transducing heads. The Hall sensor resolution, accuracy and bandwidth are maintained. In addition, the use of the Hall sensor as a temperature sensor eliminates any potential for a temperature difference between the Hall sensor and the temperature sensor.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the Hall sensor while maintaining substantially the same functionality without departing from the scope and spirit of the present invention. In addition, although the embodiments described herein are directed to a testing apparatus for magnetic recording heads, it will be appreciated by those skilled in the art that the teachings of the present invention can be applied to other systems for testing or measuring magnetic fields without departing from the scope and spirit of the present invention. Also, individual features of the Hall sensor bias circuit can be implemented in analog or digital hardware, software or a combination of these elements.

What is claimed is:

1. A head testing apparatus for testing a magnetic data recording head, the apparatus comprising:

a test volume adapted to receive the magnetic data storage head under test;

a magnetic field source positioned to generate a magnetic field within the test volume;

a Hall sensor positioned relative to the test volume and having bias current input terminals, voltage output terminals, an operating temperature and an impedance between the bias current input terminals, which varies with the operating temperature;

a first bias current source electrically coupled to the bias current input terminals and adapted to provide a first bias current to the bias current input terminals, which is modulated based on the impedance of the Hall sensor a source of a reference voltage that is representative of the impedance of the Hall sensor at a nominal temperature;

a voltage comparator circuit having a first comparison input coupled to receive a voltage developed across the bias current input terminals of the Hall sensor, a second comparison input coupled to receive the reference voltage, and a comparison output; and a current modulator having an input coupled to the comparison output and a control output coupled to a current control input of the first bias current source.

2. The head testing apparatus of claim 1 and further comprising:

a first voltage measurement circuit having a voltage measurement input coupled across the bias current input terminals of the Hall sensor and having a voltage measurement output, which is coupled to the first comparison input; and wherein the source of a reference voltage comprises:
a reference load having an operating temperature and an impedance that are substantially independent of the operating temperature of the Hall sensor;
a second bias current source coupled to the reference load and having a current control input, which is coupled to the control output of the current modulator; and
a second voltage measurement circuit having a voltage measurement input coupled across the reference load and having a voltage measurement output, which is coupled to the second comparison input.

3. A method of compensating a voltage output of a Hall sensor for changes in the temperature of the Hall sensor, the method comprising:

(a) applying a first bias current to bias current inputs of the Hall sensor;

(b) measuring a representation of an impedance of the Hall sensor, wherein the impedance of the Hall sensor varies with the temperature of the Hall sensor;

(c) modulating the first bias current as a function of the representation of the impedance of the Hall sensor measured in step (b);

(d) positioning the Hall sensor relative to a test volume of a magnetic head testing apparatus;

(e) positioning a magnetic data storage head within the test volume;

(f) generating a magnetic field within the test volume with a magnetic field source; and (g) measuring the magnetic field based on the voltage output of the Hall sensor while modulating the first bias current in step (c) to compensate the voltage output for changes in the temperature of the Hall sensor.

4. The method of claim 3 and further comprising:

(h) applying a second bias current to a reference impedance, wherein the reference impedance is substantially independent of the temperature of the Hall sensor;

(i) measuring a representation of the reference impedance; and wherein step (c) comprises modulating the first and second bias currents as a function of a comparison between the representation of the impedance of the Hall sensor and the representation of the reference impedance.

5. The method of claim 4 wherein the second bias current in step (h) has a current level that is substantially the same as a current level of the first bias current.

6. The method of claim 4 wherein the first and second bias currents are applied in steps (a) and (h) by first and second adjustable, constant current sources, respectively.

7. The method of claim 6 wherein:
step (b) comprises measuring a voltage level developed across the bias current inputs of the Hall sensor when applying the first bias current to the Hall sensor in step (a);
step (i) comprises measuring a voltage level developed across the reference impedance when applying the second bias current to the reference impedance in step (h); and
wherein step (c) comprises modulating the first and second bias currents as a function of a comparison between the voltage levels developed across the bias current inputs of the Hall sensor and the reference impedance.

8. The method of claim 3 wherein:
step (c) comprises modulating the first bias current as a function of a comparison between the representation of the impedance of the Hall sensor measured in step (b) and a representation of a nominal impedance of the Hall sensor.

9. The method of claim 8 wherein step (b) comprises measuring a voltage level developed across the bias current inputs of the Hall sensor when applying the first bias current to the Hall sensor in step (a) and wherein the method further comprises:

(h) storing a nominal impedance value for the Hall sensor and a current level value for the first bias current in a computer readable memory;

(i) calculating the impedance of the Hall sensor, with a programmed computer, based on the voltage level measured in step (b) and the current level value stored in step (d);

(j) comparing the impedance of the Hall sensor calculated in step (e) with the nominal impedance value stored in step (d) to produce a modulation control value; and (k) modulating the first bias current in step (c) as a function of the modulation control value.

10. A temperature compensated Hall sensor circuit comprising:

a Hall sensor comprising bias current input terminals, voltage output terminals, an operating temperature and an impedance between the bias current input terminals, which varies with the operating temperature; and means for applying a bias current to the bias current inputs of the Hall sensor and modulating the bias current as a function of a comparison of a representation of the impedance of the Hall sensor and a representation of a reference impedance to reduce effects of the operating temperature of the Hall sensor at the voltage output terminals of the Hall sensor.

11. A head testing apparatus for testing a magnetic data recording head, the apparatus comprising:

a test volume adapted to receive the magnetic data storage head under test;

a magnetic field source positioned to generate a magnetic field within the test volume;

a Hall sensor positioned relative to the test volume and having bias current input terminals, voltage output terminals, an operating temperature and an impedance between the bias current input terminals, which varies with the operating temperature;

a first bias current source electrically coupled to the bias current input terminals and adapted to provide a first bias current to the bias current input terminals, which is modulated based on the impedance of the Hall sensor; and a programmed computer which is coupled to the first bias current source and the Hall sensor and is programmed to:

(a) apply a control signal to the first bias current source such that the first bias current has a first current level;

(b) measure the impedance of the Hall sensor;

(c) compare the impedance of the Hall sensor with a reference impedance to produce a comparison output; and (d) adjust the control signal applied to the first bias current source as a function of the comparison output such that the first bias current has a second current level, which is different than the first current level.

* * * * *